United States Patent
Bock

(10) Patent No.: US 9,743,027 B2
(45) Date of Patent: Aug. 22, 2017

(54) IMAGE SENSOR WITH HIGH DYNAMIC RANGE AND METHOD

(71) Applicant: SEMICONDUCTOR COMPONENTS INDUSTRIES, LLC, Phoenix, AZ (US)

(72) Inventor: Nikolai Bock, San Jose, CA (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 28 days.

(21) Appl. No.: 14/748,513

(22) Filed: Jun. 24, 2015

(65) Prior Publication Data
US 2016/0381314 A1    Dec. 29, 2016

(51) Int. Cl.
*H04N 5/378*  (2011.01)
*H01L 27/146* (2006.01)
*H04N 5/355* (2011.01)
*H04N 5/3745* (2011.01)
*H04N 5/376* (2011.01)

(52) U.S. Cl.
CPC ......... *H04N 5/378* (2013.01); *H01L 27/1464* (2013.01); *H01L 27/14656* (2013.01); *H04N 5/3559* (2013.01); *H04N 5/3745* (2013.01); *H04N 5/3765* (2013.01)

(58) Field of Classification Search
CPC .. H04N 5/2355; H04N 5/378; H04N 5/23241; H04N 5/2253; H04N 5/3765
See application file for complete search history.

(56) References Cited

U.S. PATENT DOCUMENTS

| 4,873,561 | A | * | 10/1989 | Wen ............... H01L 29/76875 257/229 |
| 7,075,049 | B2 | | 7/2006 | Rhodes |
| 7,990,446 | B2 | | 8/2011 | Boemler |
| 2004/0036784 | A1 | * | 2/2004 | Bock ................ H04N 3/155 348/308 |
| 2006/0103745 | A1 | * | 5/2006 | Nagaishi ........... H04N 5/235 348/294 |

(Continued)

OTHER PUBLICATIONS

S. Decker, et al., "A 256×256 CMOS Imaging Array with Wide Dynamic Range Pixels and Column-Parallel Digital Output," IEEE Journal of Solid-State Circuits, vol. 33, No. 12, pp. 2081-2091, Dec. 1998.

(Continued)

*Primary Examiner* — Christopher K Peterson
(74) *Attorney, Agent, or Firm* — Polansky & Associates, P.L.L.C.; Paul J. Polansky

(57) ABSTRACT

In one form, a pixel for use in image sensing comprises a photodetector, a sink device, and a readout circuit. The photodetector is formed in a semiconductor substrate and has a charge collection region for receiving photocharge representative of incident light. The sink device is formed in the semiconductor substrate and adjacent to the charge collection region and has a gate overlying and insulated from the semiconductor substrate and receiving a responsivity control signal. The readout circuit transfers the photocharge collected by the charge collection region of the photodetector to an output in response to a select signal. In another form, the pixel may be used in an image sensor having a pixel array of such pixels.

18 Claims, 3 Drawing Sheets

(56) References Cited

U.S. PATENT DOCUMENTS

| | | | |
|---|---|---|---|
| 2009/0201393 A1* | 8/2009 | Tai | H01L 27/14621 |
| | | | 348/243 |
| 2010/0073538 A1* | 3/2010 | Cieslinski | H04N 3/155 |
| | | | 348/301 |
| 2010/0141819 A1* | 6/2010 | Fowler | H01L 27/14609 |
| | | | 348/302 |
| 2014/0000093 A1 | 1/2014 | Parks | |

OTHER PUBLICATIONS

N. Bock, et al., "A Wide-VGA CMOS Image Sensor with Global Shutter and Extended Dynamic Range," Proc. of IEEE Workshop on CCDs and AIS, Karuizawa, pp. 222-225, Jun. 2005.

Jung-Bum Chun, et al., "Dynamic-Range Widening in a CMOS Image Sensor Through Exposure Control Over a Dual-Photodiode Pixel," IEEE Transactions on Electronic Devices, vol. 56, No. 12, pp. 3000-3008, Dec. 2009.

M. Loose, et al., "Self-calibrating logarithmic CMOS image sensor with single chip camera functionality", Proc. of IEEE Workshop on CCDs and AIS, pp. 191-194, Jun. 1999.

S. M. Sze, Physics of Semiconductor Devices, 2nd ed., Chapter 7.4, Section 7.4.1, 8 pages, Wiley, New York, Sep. 30, 1981.

* cited by examiner

IMAGE SENSOR WITH HIGH DYNAMIC RANGE AND METHOD

FIELD OF THE DISCLOSURE

The present disclosure relates generally to image sensors, and more particularly to image sensors with high dynamic range.

BACKGROUND

Electronic image sensors are found in a variety of useful products, including cameras, camcorders, cell phones, medical devices, machine vision instruments, and the like. Image sensors have a characteristic dynamic range. Dynamic range refers to the range of incident light that can be accommodated by an image sensor in a single frame of pixel data. It is desirable to have an image sensor with a high dynamic range to image scenes that generate high dynamic range incident signals, such as indoor rooms with windows to the outside, outdoor scenes with mixed shadows and bright sunshine, night-time scenes combining artificial lighting and shadows, and many others.

For example in cameras there are generally two ways to adjust image exposure to achieve high dynamic range. The first is to change the shutter speed. The second is to change the size of the aperture. Both of these ways of adjusting image exposure control the quantity of light that is applied to film or to an electronic image sensor. In digital cameras, the image sensor can change the shutter speed electronically. However the use of pulsed light emitting diode (LED) light has become common, and keeping sensor integration time constant is even more important because of possible flickering effect related to short integration time. Moreover changing the lens aperture is not very practical for machine vision applications.

There are several known techniques for extending the dynamic range of image sensor pixels themselves, including the use of companding pixels, logarithmic pixels, dual conversion gain pixels, and dual photodiode pixels. However each of these approaches has drawbacks. A drawback of companding pixels is their nonlinear response, high pixel fixed pattern noise (FPN), and drop in signal-to-noise ratio (SNR) at knee points. The logarithmic pixel is also subject to high pixel FPN and nonlinearity. Dual conversion gain and dual photodiode pixels have only two predetermined, discrete responsivity values, which limit their usefulness.

BRIEF DESCRIPTION OF THE DRAWINGS

The present disclosure may be better understood, and its numerous features and advantages made apparent to those skilled in the art by referencing the accompanying drawings, in which.

The use of the same reference symbols in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION

Figure 1:
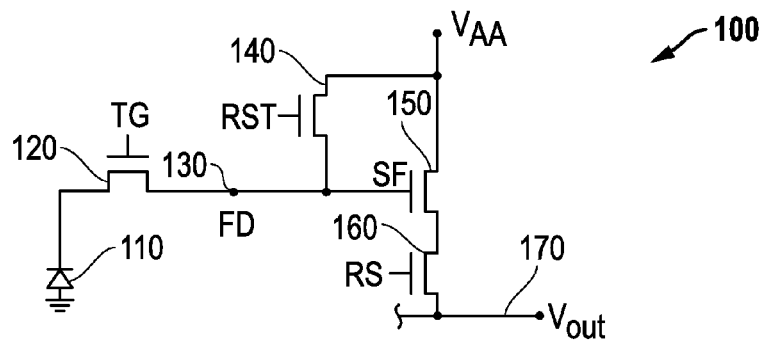
FIG. 1 illustrates in schematic form an active pixel known in the prior art.

FIG. 1 illustrates in schematic form a pixel 100 known in the prior art. Pixel 100 is an active pixel that includes a photodiode 110, a transfer gate 120, a floating diffusion 130, N-channel metal-oxide-semiconductor (MOS) transistors 140, 150, and 160, and a column conductor 170. Photodiode 110 has a cathode, and an anode connected to ground. Transistor 120 has a drain connected to a floating diffusion (FD) 130, a gate for receiving a control signal labeled "TG", and a source connected to the cathode of photodiode 110. Transistor 140 has a drain connected to a power supply voltage terminal labeled "$V_{AA}$", a gate for receiving a signal labeled "RST", and a source connected to floating diffusion 130. Transistor 150 has a drain connected to $V_{AA}$, a gate connected to floating diffusion 130, and a source. Transistor 160 has a drain connected to the source of transistor 150, a gate for receiving a signal labeled "RS", and a source connected to column conductor 170.

Signal RS is a row select signal that activates pixel 100 and all pixels within the same row of the image sensor. In a typical implementation, the image sensor uses correlated double sampling (CDS) in which the acquired image level is subtracted from the sampled reset level to compensate for fixed pattern noise. During a reset period, pixel 100 is reset in response to the activation of signal RST, which makes transistor 140 conductive and pulls up floating diffusion 130 to a relatively high voltage. During the reset period, transfer gate signal TG is inactive. Transistor 150 provides a voltage on its source corresponding to the voltage on floating diffusion 130 minus the threshold voltage of transistor 150. Since signal RS is active, transistor 160 is conductive and passes the reset level to column conductor 170.

During image acquisition, signal RST is inactive and charge carriers (in this case electrons) accumulate at the cathode of photodiode 110 in an amount corresponding to incident light. Signal TG is activated to transfer the accumulated electrons to floating diffusion 130, reducing the voltage on the floating diffusion. Transistor 150 is connected in a source follower configuration and acts as an active amplifier to buffer the voltage on the floating diffusion to provide a voltage on its source equal to $V_{FD}-V_T$, in which $V_{FD}$ is the voltage of the floating diffusion and $V_T$ is the threshold voltage of transistor 150. Since transistor 160 is conductive, this voltage is transferred to column conductor 170.

Figure 2:
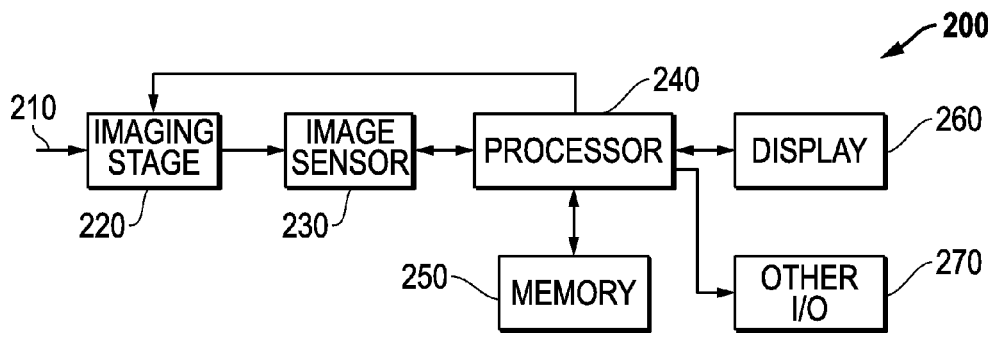
FIG. 2 illustrates in block diagram form an image processing system with high dynamic range according to the present invention.

FIG. 2 illustrates in block diagram form an image processing system 200 with high dynamic range according to the present invention. Image processing system 200 may be, for example, a digital still camera, a cell phone camera, a digital video camcorder, and the like. Image processing system 200 includes generally an imaging stage 220, an image sensor 230, a processor 240, a memory 250, a display 260, and other input/output (I/O) devices 270.

In image processing system 200, imaging stage 220 receives light 210 from a subject scene. Imaging stage 220 can include conventional elements such as a lens, a neutral density filter, an iris, and a shutter. Imaging stage 220 focuses light 210 to form an image on image sensor 230. Image sensor 230 captures images by converting the incident light into electrical signals. Processor 240 then performs post processing on the images so acquired and converts them into various formats for output on display 260 or export using other I/O devices 270. Processor 240 may be implemented, for example, with a microprocessor, microcontroller, digital signal processor (DSP), or other digital logic circuit, and processor 240 also provides signals to control various elements of image processing system 200. Processor 240 uses memory 250 to store acquired images for presentation on display 260. Display 260 may be any type of display, such as an active matrix color liquid crystal display (LCD). The other I/O devices 270 may include, for example, various on-screen controls, buttons or other user interfaces, network interfaces, memory card interfaces, and the like.

Figure 3:
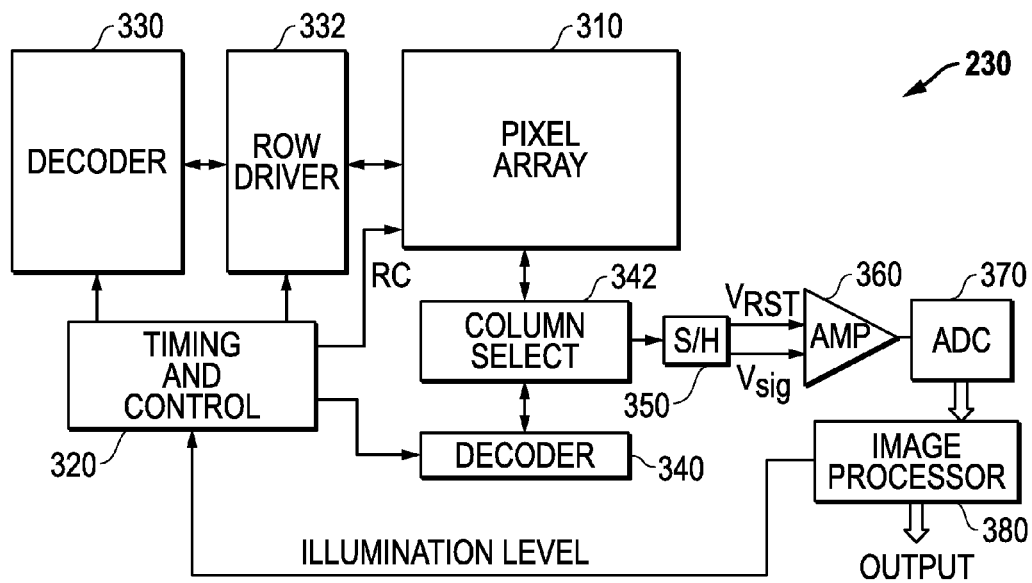
FIG. 3 illustrates in block diagram form the image sensor used in the image processing system of FIG. 2.

FIG. 3 illustrates in block diagram form the image sensor 230 used in image processing system 200 of FIG. 2. Image sensor 230 includes generally a pixel array 310, a timing and control circuit 320, a decoder 330, a row driver 332, a decoder 340, a column select circuit 342, a sample-and-hold amplifier labeled "S/H" 350, an amplifier 360, an analog-to-digital converter (ADC) 370, and an image processor 380. Pixel array 310 includes an array of pixels arranged in rows and columns. Timing and control circuit 320 controls decoder 330 to activate each selected row in sequence. Decoder 330 selects a single row line, and row driver 332 drives a corresponding row select signal across an entire row of pixel array 310. Each pixel along the selected row is activated at the same time by the common row select line, and provides an output to a respective column line.

In the illustrated embodiment, timing and control circuit 320 also selects the columns in sequence by providing a column address to decoder 340. Decoder 340 provides a column select signal to column select circuit 342. Column select circuit 342 connects the column line to sample-and-hold amplifier 350. Sample-and-hold amplifier 350 provides both a reset level labeled "$V_{RST}$" and a signal level labeled "$V_{SIG}$" to amplifier 360. Amplifier 360 is a voltage amplifier which subtracts the signal level from the reset level to compensate for fixed pattern noise. Analog-to-digital converter 370 receives the difference voltage and provides a digital code representative of the noise-compensated signal level of the pixel to image processor 380, which accumulates to the signals to form an entire image. Image processor 380 performs additional image processing functions to provide a processed image signal labeled "OUTPUT", and provides an output signal labeled "ILLUMINATION LEVEL" to timing and control circuit 320 to represent the light intensity of the whole image or certain portions thereof.

In addition, timing and control circuit 320 provides a special responsivity control signal labeled "RC" to pixel array 310. Timing and control circuit 320 uses signal RC to adjust the responsivity of pixels in pixel array 310 to keep selected pixels from saturating and thereby improve dynamic range. In one form, timing and control circuit 320 provides signal RC based on the intensity of light of the whole image. In this example, timing and control circuit 320 operates as a variable voltage source that provides the RC signal in response to the ILLUMINATION LEVEL. In another form, timing and control circuit 320 provides signal RC at different levels based on the intensity of light of particular portions of the image, such as on a row-, column-, or region-basis. Each pixel in pixel array 310 is modified in a manner to be described below to use the value of the RC signal to adjust the saturation level of the pixel, thus providing a wider overall dynamic range.

Figure 4:
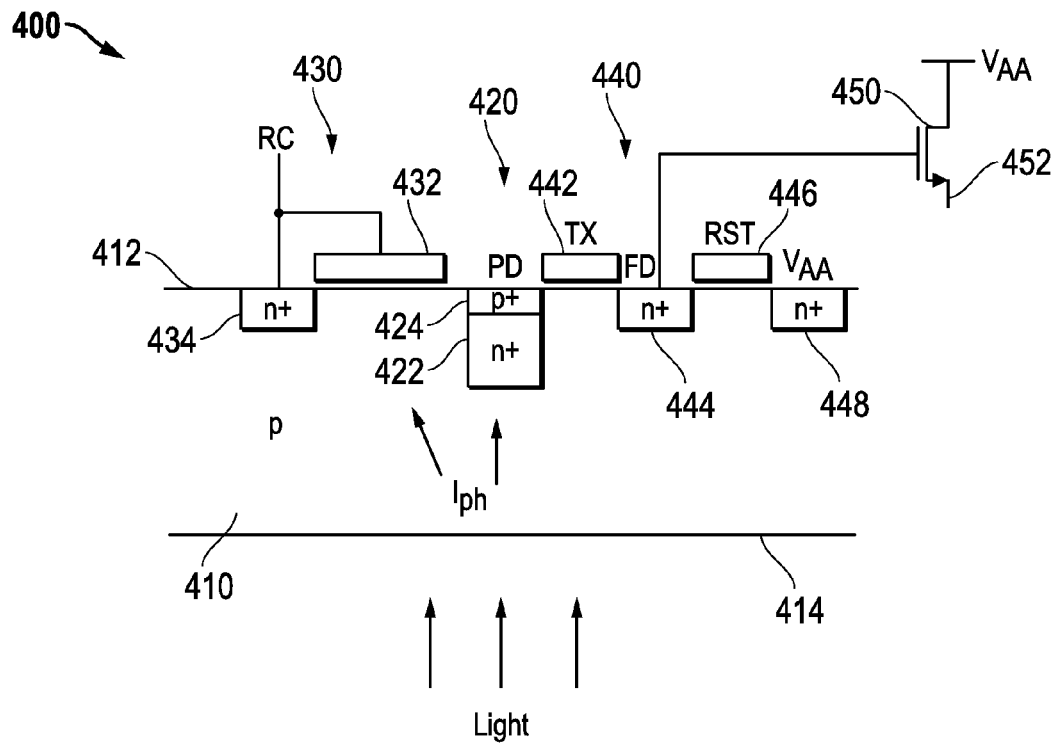
FIG. 4 illustrates a cross section of a pixel with an associated source follower transistor used in the image sensor of FIG. 3.

FIG. 4 illustrates a cross section of a pixel 400 with an associated source follower transistor 450 used in image sensor 230 of FIG. 3. Pixel 400 is formed in a semiconductor substrate 410 having a front surface 412 and a back surface 414. Pixel 400 includes generally a photodiode region 420, a responsivity control gate region 430, a readout circuit region 440, and source follower transistor 450.

Photodiode region 420 includes a buried n+ cathode region 422 underlying a p+ isolation region 424 in a surface portion of semiconductor substrate 410 near front surface 412 to form a pinned photodiode.

Responsivity control gate region 430 includes a gate 432 isolated from front surface 412 by a thin layer of gate oxide, and an n+ drain region 434. Gate 432 and drain region 434 are connected together and receive signal RC, thus forming a diode-connected MOS transistor.

Readout circuit region 440 includes a transfer gate 442, an n+ floating diffusion 444, a reset gate 446, and an n+ drain region 448 connected to power supply voltage terminal $V_{AA}$. Each of gates 442 and 446 is isolated from front surface 412 by a thin layer of gate oxide and is used to induce a conductive channel for conducting electrons in response to the application of a positive voltage above the threshold voltages of the respective transistors.

Transistor 450 has a drain connected to $V_{AA}$, a gate connected to floating diffusion region 444, and a source connected to node 452, which itself is further connected to a drain of a row select transistor, not shown in FIG. 4.

Pixel 400 operates as described with respect to pixel 100 of FIG. 1 except that it includes an additional sink device in the form of a MOS diode-connected transistor. Gate 432 selectively forms a conductive channel between the pinned photodiode and drain region 434 based on the voltage of signal RC. Drain region 434 collects photocurrent based on the potential of signal RC. When the potential under gate 432 is low, no depletion layer will form and most photocurrent formed by backside incident light will be collected by cathode 422. The depletion layer under gate 432 is always in a non-stationary condition because n+ drain region 434 prevents mobile inversion charge build-up under gate 432. All photo electrons attracted by gate 432 are swept into the virtual power supply driving the RC node, helping to create a deep depletion region. Surface potential under gate 432 is given by:

$$V_{RC} - V_{FB} = \varphi_s + \frac{\sqrt{2\varepsilon_s q N_A \varphi_s}}{C_{ox}} \quad [1]$$

in which $V_{RC}$ is the voltage of gate 432, $V_{FB}$ is the flat band voltage, $\varphi_s$ is the surface potential, $\varepsilon_s$ is the silicon dielectric permittivity, q is the electron charge, $N_A$ is the substrate doping concentration, $C_{ox}$ is the oxide capacitance. The pixel photocurrent $I_{ph}$ can be expressed by:

$$I_{ph} = I_{PD} + I_{RC} \quad [2]$$

in which $I_{PD}$ is the photodiode current and $I_{RC}$ is the RC gate current. The ratio of these two currents can be estimated by:

$$\frac{I_{PD}}{I_{RC}} \sim \frac{W_{PD}}{W_{RC}} \quad [3]$$

in which $W_{PD}$ is the volume of the PD depletion region and $W_{RC}$ is the volume of the RC gate depletion region.

A pixel with a sink device such as a diode-connected MOS transistor controlled by a responsivity control gate provides the ability to control photodiode current and thus maximum light intensity causing saturation of the pixel. This feature is useful for high dynamic range and machine vision applications, especially when pulsing LED light prohibits using short integration time. Using a diode-connected transistor biased to a virtual supply node helps with crosstalk reduction. In addition, the responsivity control gate can also be used for white balance purposes.

Figure 5:
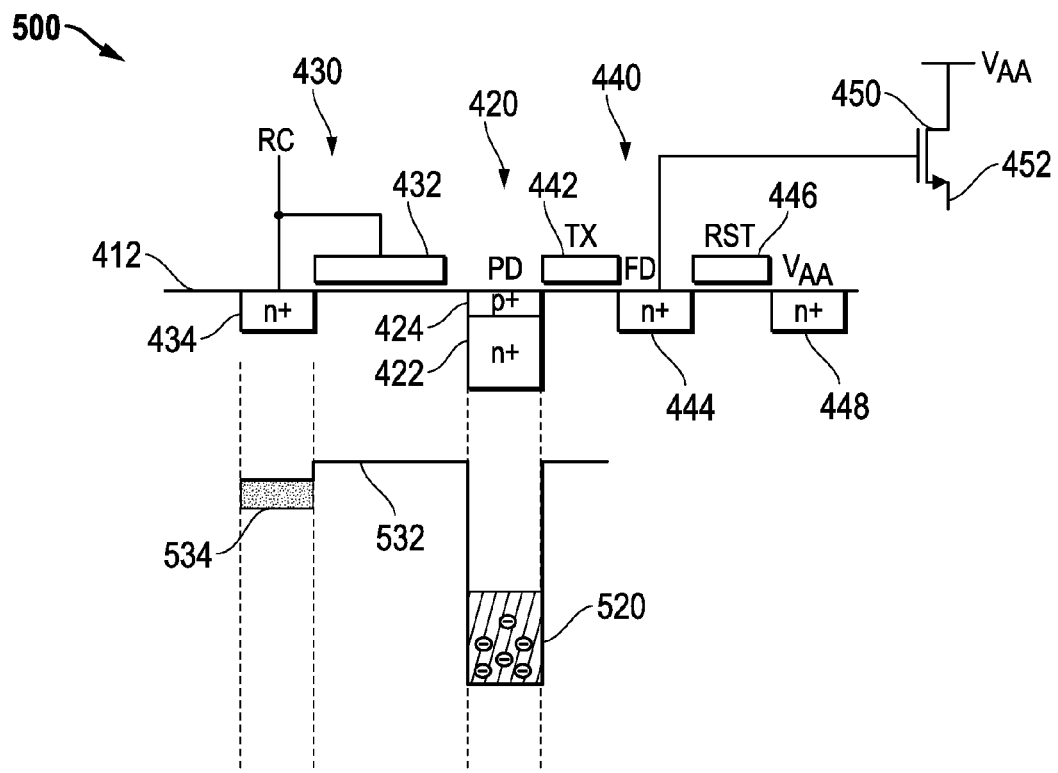
FIG. 5 illustrates the cross section of the pixel of FIG. 4 with a corresponding potential well diagram under a first bias condition.

FIG. 5 illustrates the cross section of pixel 400 of FIG. 4 with a corresponding potential well diagram 500 under a first bias condition. The first bias condition corresponds to signal $V_{RC}$ at a low potential. A potential well 520 is formed by the cathode of photodiode 420, and causes photocharge to build up over the integration period. The low value of $V_{RC}$ forms a significant potential barrier such that substantially no electrons are able to reach drain region 434 and substantially all the accumulated photocharge remains in potential well 520 under cathode 422.

Figure 6:
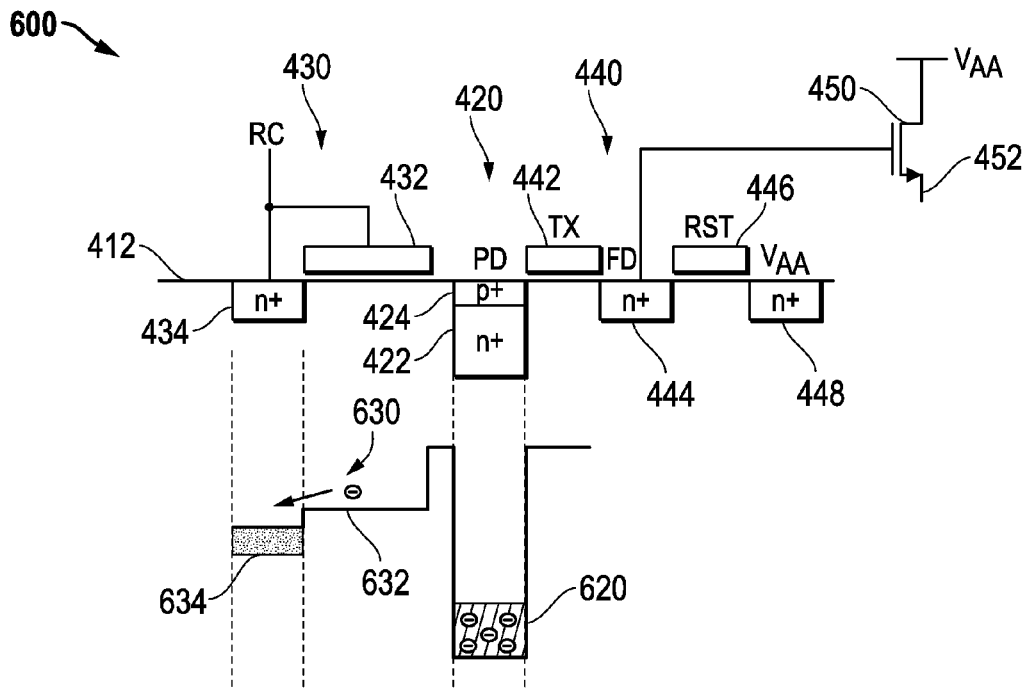
FIG. 6 illustrates the cross section of the pixel of FIG. 4 with a corresponding potential well diagram under a second bias condition.

FIG. 6 illustrates the cross section of pixel 400 of FIG. 4 with a corresponding potential well diagram 600 under a second bias condition. The second bias condition corresponds to signal $V_{RC}$ at a medium potential. A potential well 620 is again formed by the cathode of photodiode 420, and causes photocharge to build up over the integration period. The medium voltage of $V_{RC}$ forms a small potential well 632 under gate 432 and some electrons are able to reach drain region 434. Thus at medium potential bias, pixel 400 saturates at a higher illumination level than at low bias.

Figure 7:
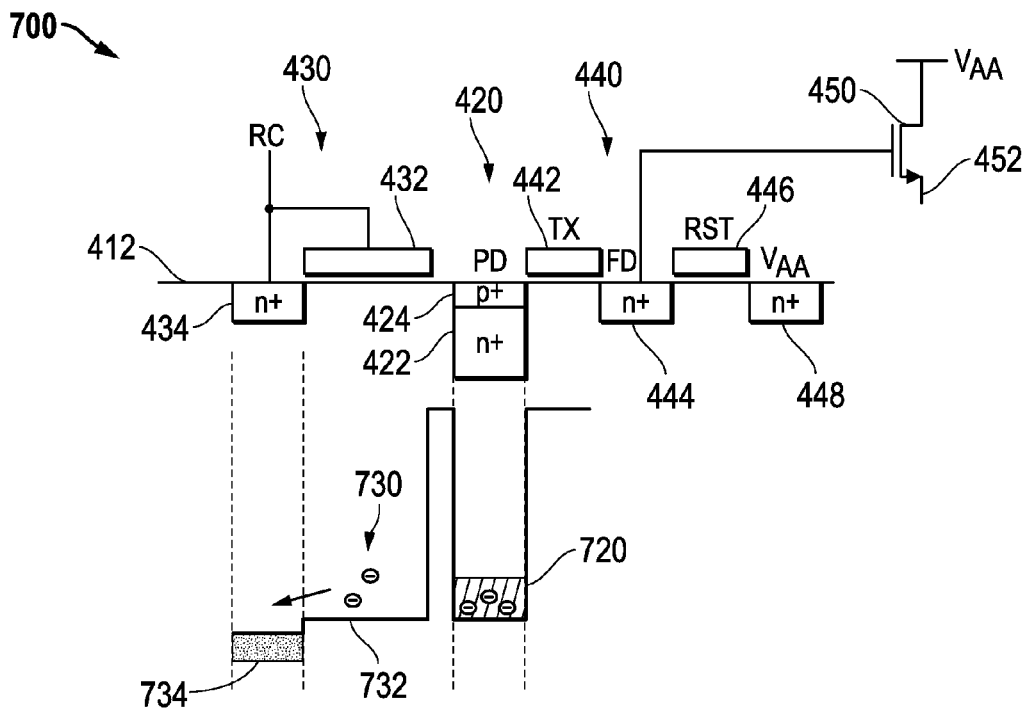
FIG. 7 illustrates the cross section of the pixel of FIG. 4 with a corresponding potential well diagram under a third bias condition.

FIG. 7 illustrates the cross section of the pixel of FIG. 4 with a corresponding potential well diagram 700 under a third bias condition. The third bias condition corresponds to signal $V_{RC}$ at a high potential. A potential well 720 is again formed by the cathode of photodiode 420, and causes photocharge to build up over the integration period. The high voltage of $V_{RC}$ forms a large potential well 732 under gate 432 and many electrons are able to reach drain region 434. Thus at high potential bias, pixel 400 saturates at a higher illumination level than at medium bias.

The saturation level increases monotonically with increasing $V_{RC}$ voltage. The increase need not be linear and timing and control circuit 320 can select the bias voltage $V_{RC}$ from a lookup table to correspond to the desired saturation level.

Thus, a pixel with adjustable responsivity includes a sink device, such as a diode-connected MOS transistor, that can be dynamically biased to control the responsivity and hence the intrascene dynamic range of the image sensor. An image array formed by such pixels is responsive to one or more responsivity control signals to increase or decrease the responsivity of the array or of certain portions of the array based on the ILLUMINATION LEVEL of the scene.

The above-disclosed subject matter is to be considered illustrative, and not restrictive, and the appended claims are intended to cover all such modifications, enhancements, and other embodiments that fall within the true scope of the claims. For example in other embodiments, the conductivity type of the semiconductor substrate, photodiode, and transistors can be reversed. Moreover the image sensor and image processing system can be used to increase the dynamic range of a variety of different electronic products.

Thus, to the maximum extent allowed by law, the scope of the present invention is to be determined by the broadest permissible interpretation of the following claims and their equivalents, and shall not be restricted or limited by the foregoing detailed description.

What is claimed is:

1. An image sensor comprising a pixel array, each pixel of said pixel array comprising:
  a photodetector formed in a semiconductor substrate and having a charge collection region for receiving photocharge representative of incident light;
  a sink device formed in said semiconductor substrate and adjacent to said charge collection region having a gate overlying and insulated from said semiconductor substrate and receiving a responsivity control signal, and having a drain receiving said responsivity control signal; and
  a readout circuit for transferring said photocharge collected by said charge collection region of said photodetector to an output in response to a select signal,
wherein the image sensor further comprises:
  a timing and control circuit coupled to said pixel array, wherein said timing and control circuit provides different responsivity control signals to respective groups of pixels in said pixel array.

2. The image sensor of claim 1 wherein said sink device is on a first side of said charge collection region and said readout circuit is on a second side of said charge collection region opposite said first side.

3. The image sensor of claim 1 further comprising:
  a variable voltage source for providing said responsivity control signal in response to a measured illumination level.

4. The image sensor of claim 1 wherein:
  said incident light comprises light incident upon a back surface of said semiconductor substrate.

5. The image sensor of claim 1 wherein:
  said photodetector comprises a buried photodiode.

6. The image sensor of claim 5 wherein:
  said buried photodiode comprises a pinned photodiode.

7. The image sensor of claim 1 wherein said readout circuit comprises:
  a transfer gate adjacent to said photodetector and formed in a front surface of said semiconductor substrate and insulated from said front surface of said semiconductor substrate, for forming a conductive channel from said charge collection region to a floating diffusion; and
  a source follower transistor having a drain coupled to a power supply voltage terminal, a gate coupled to said floating diffusion, and a source for providing a pixel output signal.

8. The image sensor of claim 1, wherein said respective groups of pixels comprise rows of pixels.

9. The image sensor of claim 1, wherein said respective groups of pixels comprise columns of pixels.

10. The image sensor of claim 1, wherein said respective groups of pixels comprise regions of pixels.

11. The image sensor of claim 1, further comprising:
  an image processor having an input coupled to said output of said readout circuit, wherein said image sensor determines respective intensities of light of said group of pixels and a second group of pixels and provides respective illumination level signals in response, wherein said timing and control circuit provides said different responsivity control signals in response to said respective illumination level signals.

12. A method for converting incident light into an electrical signal, comprising:
   collecting a first charge in a charge collection region of a first pixel in response to said incident light;
   diverting a portion of said first charge to a first drain in response to a level of a first responsivity control signal;
   biasing said first drain using said first responsivity control signal;
   generating said first responsivity control signal in response to an intensity of light of a first group of pixels including said first pixel;
   collecting a second charge in a charge collection region of a second pixel in response to said incident light;
   diverting a portion of said second charge to a second drain in response to a level of a second responsivity control signal;
   biasing said second drain using said second responsivity control signal;
   generating said second responsivity control signal different from said first responsivity control signal in response to an intensity of light of a second group of pixels including said second pixel; and
   reading out remaining charge from each of said charge collection regions of said first and second pixels.

13. The method of claim 12 wherein said reading out comprises:
   transferring said remaining charge of said charge collection region of said first pixel to a floating diffusion; and
   providing a voltage on an output line in response to said charge in said floating diffusion.

14. The method of claim 13 wherein said reading out further comprises:
   resetting a voltage of said floating diffusion to a predetermined voltage prior to said diverting.

15. The method of claim 14, wherein said reading out further comprises:
   sampling a voltage on said floating diffusion after said resetting;
   sampling said voltage on said floating diffusion after reading out said remaining charge; and
   subtracting said voltage on said floating diffusion after said resetting from said voltage on said floating diffusion after reading out said remaining charge to form a pixel output signal.

16. The method of claim 12, wherein generating said first responsivity control signal in response to said intensity of light of said first group of pixels including said first pixel comprises generating said first responsivity control signal in response to an intensity of light of a row of pixels.

17. The method of claim 12, wherein generating said first responsivity control signal in response to said intensity of light of said first group of pixels including said first pixel comprises generating said first responsivity control signal in response to an intensity of light of a column of pixels.

18. The method of claim 12, wherein generating said first responsivity control signal in response to said intensity of light of said first group of pixels including said first pixel comprises generating said first responsivity control signal in response to an intensity of light of a region of pixels.

* * * * *